United States Patent
Vaufrey

(10) Patent No.: US 9,905,734 B2
(45) Date of Patent: Feb. 27, 2018

(54) EMISSIVE STRUCTURE WITH LATERAL CARRIER INJECTION

(71) Applicant: COMMISSARIAT A L'ENERGIE ATOMIQUE ET AUX ENERGIES ALTERNATIVES, Paris (FR)

(72) Inventor: David Vaufrey, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/330,472

(22) Filed: Jul. 14, 2014

(65) Prior Publication Data
US 2015/0014736 A1 Jan. 15, 2015

(30) Foreign Application Priority Data
Jul. 15, 2013 (FR) .................. 13 56948

(51) Int. Cl.
*H01L 33/38* (2010.01)
*H01L 33/14* (2010.01)
(Continued)

(52) U.S. Cl.
CPC .......... *H01L 33/382* (2013.01); *H01L 33/005* (2013.01); *H01L 33/145* (2013.01);
(Continued)

(58) Field of Classification Search
CPC .... H01L 33/382; H01L 33/385; H01L 33/145
See application file for complete search history.

(56) References Cited

U.S. PATENT DOCUMENTS 5,821,569 A * 10/1998 Dutta .................. H01L 33/10
257/96
2009/0039371 A1 2/2009 Kim et al.
(Continued)

FOREIGN PATENT DOCUMENTS

| EP | 2 315 273 A1 | 4/2011 |
| EP | 2 330 643 A2 | 6/2011 |
| EP | 2 341 557 A2 | 7/2011 |

OTHER PUBLICATIONS

French Search Report and Written Opinion dated Apr. 9, 2014, issued in corresponding application No. FR 1356948 (w/English partial translation and partial machine-translation).

*Primary Examiner* — Yu Chen
(74) *Attorney, Agent, or Firm* — Westerman, Hattori, Daniels & Adrian, LLP

(57) ABSTRACT

The structure intended to emit electromagnetic radiation, comprises first and second electrodes configured so as to allow carriers to be injected into at least one semiconductor-based stack with a view to making them recombine in an active zone of the stack in order to form all or some of the electromagnetic radiation to be emitted. The first electrode has at least one first face for injecting carriers into the stack, said face being oriented in a different direction to the direction in which the stack is formed. The second electrode comprise a second face for injecting carriers into the stack, wherein said second injection face comprises a first portion facing the first electrode and a second portion for which the first electrode is not facing, and a dielectric element, making contact with the first electrode, is interposed between at least one part of the first electrode and at least one part of the first portion.

20 Claims, 6 Drawing Sheets

(51) Int. Cl.
   *H01L 33/00* (2010.01)
   *H01L 33/40* (2010.01)
   *H01L 27/15* (2006.01)

(52) U.S. Cl.
   CPC .......... *H01L 27/156* (2013.01); *H01L 33/385* (2013.01); *H01L 33/405* (2013.01)

(56) References Cited

U.S. PATENT DOCUMENTS

| | | | |
|---|---|---|---|
| 2009/0045426 A1* | 2/2009 | Fehrer | H01L 33/04 257/98 |
| 2009/0184337 A1 | 7/2009 | Fan et al. | |
| 2011/0127565 A1 | 6/2011 | Son | |
| 2011/0133221 A1* | 6/2011 | Choi et al. | 257/88 |
| 2011/0156089 A1 | 6/2011 | Hwang | |
| 2011/0210362 A1* | 9/2011 | Lee et al. | 257/98 |
| 2011/0233517 A1* | 9/2011 | Hwang | H01L 33/14 257/13 |
| 2012/0086038 A1 | 4/2012 | Hwang | |
| 2013/0328075 A1* | 12/2013 | Tajima et al. | 257/94 |

* cited by examiner

EMISSIVE STRUCTURE WITH LATERAL CARRIER INJECTION

TECHNICAL FIELD OF THE INVENTION

The invention relates to the field of light-emitting diodes, preferably based on III-V or II-VI materials, and more particularly to the electrodes used to power a diode.

More particularly, the subject of the invention is a structure, intended to emit electromagnetic radiation, comprising first and second electrodes configured so as to allow carriers to be injected into at least one semiconductor-based stack with a view to making them recombine in an active zone of the stack in order to form all or some of the electromagnetic radiation to be emitted. The first electrode has at least one first face for injecting carriers into the stack, said first face being oriented in a different direction to the direction in which the stack is formed, and the second electrode comprises a second face for injecting carriers into the stack.

PRIOR ART

A light-emitting diode is generally composed of a stack of at least two semiconductor materials of opposite conductivity type, which stacks are inserted between two electrodes. When a voltage is applied between the two electrodes, carriers are injected via said electrodes into the stack of semiconductors and then transported through the semiconductors. Electrons are injected from the cathode whereas holes are injected from the anode. Electron-hole pairs may form in an active zone of the stack, and may possibly couple to form excitons that may possibly decay radiatively. The photons generated may possibly escape from the stack of semiconductors if, at the very least, one of the electrodes is transparent or semitransparent or one of the electrodes does not completely cover one face of the light-emitting diode or indeed if these two aforementioned possibilities are combined together.

FIG. 1 illustrates a conventional light-emitting diode comprising a first electrode 1 and a second electrode 2 between which a stack 3 comprising an active zone 4 (part of which, indicated by dotted lines, sees a current) is interposed. The first electrode 1 covers only part of the upper surface of the stack, so as to allow photons to be emitted in the direction of the arrows F1. The current density in such a light-emitting diode is maximal between the two electrodes 1 and 2 in a volume 5 that is said to be "shadowed" because a portion of the second electrode 2 is covered by the first electrode 1. Thus, most carrier recombination takes place in this volume 5 even though the first electrode 1 then hinders emission of the photons obtained in the direction F1 because of its low transparency or non-transparency.

To overcome this problem it has been proposed to insert a spreading layer between the first electrode 1 and the active zone 4. The spreading layer is characterized by a high conductivity that allows current to disperse more widely, thereby allowing an active zone covering a larger area to be obtained. This allows the efficiency of the light-emitting diode in terms of photon emission to be improved.

Another solution, illustrated in FIG. 2, is to place a blocking layer 6 between the first electrode 1 and the active zone 4, level with the "shadowed" volume 5 located between the first electrode 1 and the second electrode 2.

The blocking layer 6 is defined by forming an energy barrier limiting the passage of at least one carrier type. The barrier height for electrons (holes) is equal to the difference between the valence (conduction) levels of the spreading layer and of the blocking layer. The presence of the structured blocking layer makes the current pass around it. The active zone then sees a current in an annular emission region centred on the vertical of the second electrode 2 outside the zone covered by the first electrode 1. This solution has the advantage that current does not flow through the part of the active layer located in the volume shadowed by the first electrode 1.

However, the blocking effect decreases as the voltage applied between the electrodes increases, to the point that, for high voltages, the current behaves as though the blocking layer were not present. In addition, inserting the structured blocking layer requires the epitaxial growth of the stack to be stopped in order to carry out an etching step after a photolithography operation. This stop is costly in time, equipment and resources and therefore in money.

Yet another solution is described in patent application EP 2 341 557. This solution requires the use of materials able to be doped by implantation in order to be economical (i.e. in order not to multiply the number of steps of lithography, etching and epitaxial regrowth).

Thus, there is therefore a need to improve present-day light-emitting diodes in order to increase the emission efficiency thereof, and preferably while retaining solutions that are viable in terms of their technical implementation.

SUBJECT OF THE INVENTION

The aim of the present invention is to provide a solution especially allowing the emission of electromagnetic radiation from a structure to be improved.

This aim is at least partially achieved especially in that said second injection face, which is especially contained in a plane, comprises a first portion facing the first electrode and a second portion for which the first electrode is not facing, and in that a dielectric element, making contact with the first electrode, is interposed between at least one part of the first electrode and at least one part of the first portion.

Preferably, the stack comprises a first semiconductor element doped with a first dopant, in particular an n-type dopant, and a second semiconductor element doped with a second dopant of opposite conductivity to the first dopant, and the first injection face is configured so as to inject carriers of a first type into the first semiconductor element, and the second electrode is configured so as to inject carriers of a second type into the second semiconductor element.

According to one particular embodiment, the dielectric element makes contact with:
  the first electrode and the first semiconductor element; or
  the first electrode, the first semiconductor element and the second semiconductor element; or
  the first electrode, the first semiconductor element, the second semiconductor element and the second electrode.

Advantageously, at least one portion of the first electrode extending from the dielectric element in a direction opposite to the second electrode is encircled by and makes contact with the first semiconductor element.

According to one particular embodiment, the structure comprises at least two separate stacks extending from the second electrode, and:
  the dielectric element extends from the second electrode between the stacks, and makes contact with one part, bounded at least by the first and second semiconductor elements, of a sidewall of each of the stacks; and
  the first electrode extends from the dielectric element at least partially between the two stacks, said first electrode making contact with another part, bounded by the first semiconductor element, of the sidewall of each of the stacks.

According to one embodiment, the first electrode comprises at least two additional faces for injecting carriers into the stack, each additional face being contained in planes shifted from and substantially parallel to the plane containing the second electrode, and preferably one of the additional faces makes contact with that end of the stack which is opposite the second electrode, and is connected to the other additional face via the first injection face.

The invention also relates to an emissive device, especially a displaying or illuminating device, comprising at least one structure such as described above.

The invention also relates to a process for fabricating a structure such as described; such a fabrication process comprises a step of forming, especially by growth, the stack, and a step of forming, especially by deposition, the first electrode.

Preferably, the process comprises a step of forming the second electrode such that it comprises a second face for injecting carriers into the stack, said second injection face, which is especially contained in a plane, comprising a first portion facing the first electrode and a second portion for which the first electrode is not facing, and a dielectric element, especially making contact with the first electrode, is interposed between at least one part of the first electrode and at least one part of the first portion.

Preferably, the step of forming the stack comprises forming a first semiconductor element and a second semiconductor element that is intended to be interposed between the first semiconductor element and the second electrode.

According to one particular embodiment, the process comprises a step of etching at least the first semiconductor element in the direction of the second semiconductor element, and it comprises a step of forming, especially by deposition, the dielectric element in at least one part of the hole created by the etching step, the step of forming the first electrode being carried out by forming said first electrode on the dielectric element, said first electrode occupying at least one part of the rest of the hole.

According to one embodiment, the process comprises the following steps:
  forming at least two separate stacks, each stack being equipped with a first semiconductor element and a second semiconductor element, especially on a carrier substrate having a crystal structure suitable for growth of the stacks;
  forming the dielectric element in a free space separating the stacks, especially by conformal deposition of said dielectric element; and
  forming the first electrode so that it makes contact with the dielectric element and with one part of that sidewall of the stacks which is formed by the first semiconductor elements of said stacks.

BRIEF DESCRIPTION OF THE DRAWINGS

Other advantages and features will become more clearly apparent from the following description of particular embodiments of the invention which are given by way of nonlimiting example and illustrated in the appended drawings, in which.

DESCRIPTION OF PREFERRED
EMBODIMENTS OF THE INVENTION

The structure described below especially differs from the prior art in that one electrode, especially for injecting electrons, has at least one face for injecting carriers (electrons in the example) arranged laterally relative to the direction of a semiconductor-based stack.

For the sake of the present description, a stack may be defined as having two opposite stack ends in the direction in which the stack is formed. Moreover, these two stack ends are connected by a sidewall. In particular, the perimeter of each stack end forms the interface connecting said stack end to the sidewall. The sidewall may comprise one or more faces.

Figure 1:
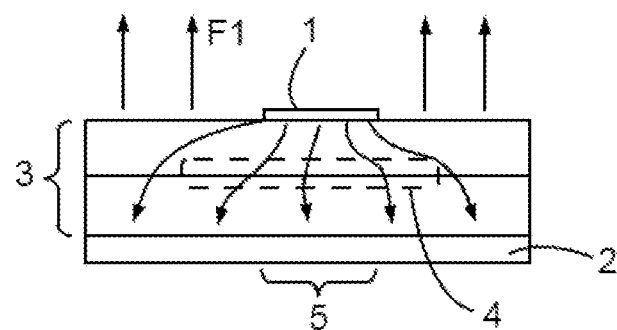
FIG. 1 is a side view of a prior-art light-emitting diode.
Figure 2:
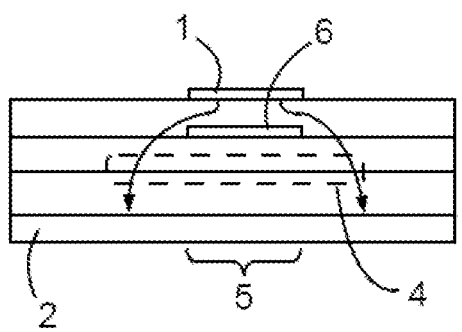
FIG. 2 is a view of another prior-art light-emitting diode.
Figure 3:
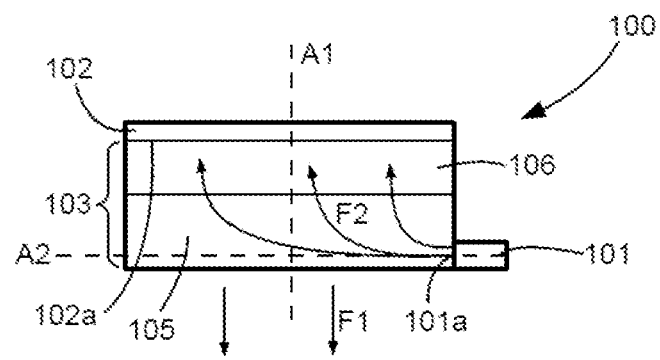
FIG. 3 is a view of a structure according to one particular embodiment of the invention.

As illustrated in FIG. 3, a structure 100 intended to emit electromagnetic radiation comprises first 101 and second 102 electrodes configured so as to allow carriers to be injected into at least one semiconductor-based stack 103 with a view to making them recombine in an active zone of the stack 103 in order to form all or some of the electromagnetic radiation to be emitted (preferably in the direction of the arrows F1).

The first and second electrodes may be formed from, or consist of, any material able to inject carriers into the stack of the light-emitting diode. In the case of a GaN-based light-emitting diode, the cathode will preferably be made of titanium and the anode of palladium (or nickel).

Moreover, the first electrode 101 has at least one first face 101a for injecting carriers into the stack 103, which first face is oriented in a different direction to the direction in which the stack is formed. In other words, a normal to the first injection face 101a at any point on the first injection face 101a forms an angle that is preferably substantially perpendicular to the direction in which the stack is formed. It will be understood that such lateral carrier injection relative to the direction in which the stack is formed will make it possible to promote distribution (arrows F2) of the current in the stack to zones where there is no overlap between the first electrode 101 and the second electrode 102.

Advantageously, the first injection face is contained in a plane that is substantially perpendicular to the plane containing one of the stack ends. Preferably, the two stack ends are contained in first and second parallel planes, respectively, and the first injection face is contained in a third plane that is substantially perpendicular to the first and second planes.

Generally, that face of the stack which is opposite the second electrode, forming one stack end, is also the emission face of the stack. It will thus be understood that electromagnetic radiation escapes from the stack via this emission face. In other words, the structure has a face via which electromagnetic radiation is emitted, which face is opposite the second electrode, said emission face comprising a shadowed zone bounded by the first electrode. Thus, it will be understood that the first electrode is advantageously arranged level with or on this emission face.

In the particular example in FIG. 3, the first electrode only makes contact with the stack via the sidewall of the stack 103. In other words, the emission face and the first electrode 101 do not overlap. As a result, such a structure will be able to emit more photons than prior-art structures since the emission face of the latter will not be shadowed at all.

Again with reference to FIG. 3, the direction of the stack 103 is defined along the axis A1 along which the various semiconductor elements (or layers) are stacked, and the direction in which the first injection face is oriented is along the axis A2. The axes A1 and A2 are here advantageously substantially perpendicular to each other.

Figure 4:
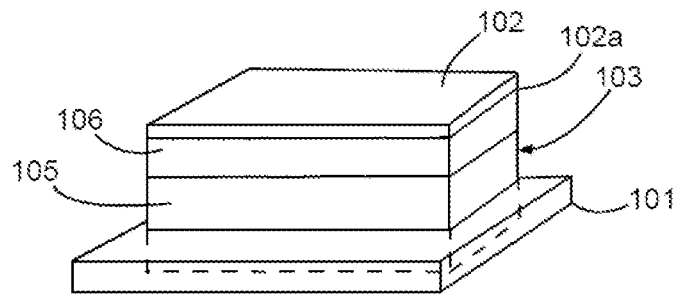
FIG. 4 is a perspective view of a variant of FIG. 3.

According to one variant, the first electrode 101 may comprise a plurality of first injection faces oriented according to the same law (oriented in a different direction to the direction in which the stack is formed). FIG. 4 illustrates such an embodiment in so far as the first electrode 101 encircles all or some of the stack 103. Thus, in FIG. 4, the first electrode 101 forms a ring the entire area of the internal wall of which is arranged so as to allow carriers to be injected into the stack 103.

Figure 5:
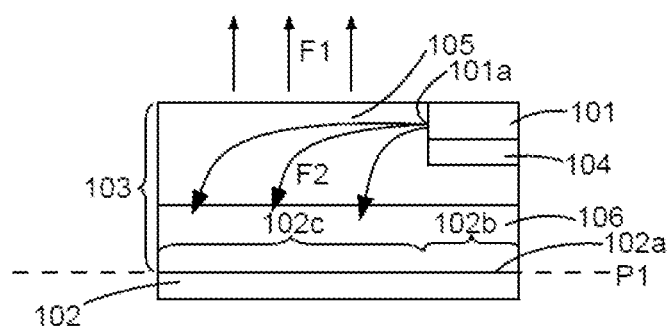
FIG. 5 is a view of a structure according to another embodiment of the invention.

According to one particular embodiment, illustrated in FIG. 5, the second electrode 102 comprises a second face 102a for injecting carriers into the stack 103. The second injection face 102a is especially contained in a plane P1 (the plane P1 being in this particular example perpendicular to the plane of FIG. 5). The second injection face 102a comprises a first portion 102b facing the first electrode 101 and a second portion 102c for which the first electrode 101 is not facing. It will be understood that if it is desired to obtain a structure optimising photon emission (especially in the direction of the arrows F1, i.e. via the emission face of the structure bounded by the stack end opposite the second electrode 102), the second portion 102c of the second injection face 102a must have a larger area than that associated with the first portion 102b of the second injection face 102a. The ratio of the area of the first portion 102b to the area of the second portion 102c may range from ½ to ¹⁄₁₀₀. Moreover, a dielectric element 104, preferably making contact with the first electrode 101, is interposed between at least one part of the first electrode 101 and at least one part of the first portion 102b. The wording of the last sentence is understood to mean that only one part, or all the parts, (which part(s) is/are especially contained in planes substantially parallel to the plane of the second electrode) of the first electrode oriented towards the second electrode may make contact with the dielectric element 104. The role of this dielectric element 104 is to prevent current from taking the shortest path into a zone across which the first and second electrodes 101, 102 face, as this would promote carrier recombination in a zone of the stack where correct delivery of the electromagnetic radiation associated with said recombination is not possible.

Moreover, preferably as a result of the contact between the dielectric element 104 and the first electrode 101 the injection of carriers via the first electrode 101 takes place via a lateral part of the first electrode formed above the dielectric element 104. This lateral part then forms the first injection face 101a.

The expression "the second injection face 102a comprises a first portion 102b facing the first electrode 101 and a second portion 102c for which the first electrode 101 is not facing" is understood to mean that a straight line normal to the first portion 102b of the second injection surface 102 passes through the first electrode 101 at any point on the first portion 102b, and that a straight line normal to the second portion 102b of the second injection surface 102 does not pass through the first electrode 101 at any point on the second portion 102b, respectively.

More generally, in the present description the expression "A is facing B" is understood to mean that a straight line normal to A, at any point bounded by A, passes through B. A and B possibly being any type of element but A preferably being an advantageously planar face.

More particularly, the insertion of the dielectric element 104 bars direct and vertical passage of the carriers from the first electrode 101 to the second electrode 102. On the contrary, the carriers are constrained to follow a curved path, as symbolized by the curved arrows F2 in FIG. 5, and to disperse in the stack 103 in order to pass through the active zone in a zone not facing the first electrode 101. Thus, the current injected into the structure via the first and second electrodes 101, 102 passes through the active zone preferably only in zones where the photons emitted will be able to escape from the structure. In this configuration, the current does not, or most of the current does not, pass through the active zone in the part of the stack 103 interposed between the dielectric element 104 and the second electrode 102.

Generally, the dielectric element may be formed of silica, of silicon nitride or oxynitride, or even be a multilayer of these materials. Advantageously, the one or more materials used are able to passivate the sidewall of the stack 103. Thus, the formation of the dielectric element will possibly be accompanied by a concomitant deposition of the same material on the sidewall of the stack 103.

It will be understood from FIG. 5 that all or some of the first electrode is embedded in the stack.

Figure 6:
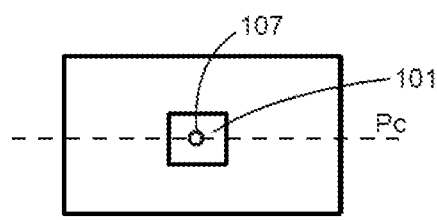
FIG. 6 is a view of a variant of FIG. 5.
Figure 7:
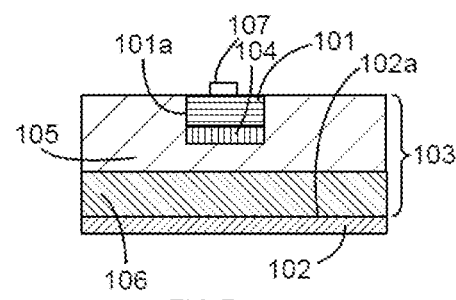
FIGS. 7 to 9 are alternative cross-sectional views of the cross-sectional plane Pc in FIG. 6.

According to one alternative to FIG. 5 in which the first electrode 101 is embedded in the stack 103 at one edge of the stack 101, FIGS. 6 and 7 illustrate one variant in which the first electrode 101 is embedded in the stack in a central zone of the emission face of the structure. The dielectric element 104 is then entirely covered, on the one hand, by the stack, and on the other hand, by the first electrode 101.

As illustrated in FIGS. 3, 4, 5 and 7, generally the stack 103 may comprise a first semiconductor element 105 doped with a first dopant and a second semiconductor element 106 doped with a second dopant of opposite conductivity to the first dopant. In this case, the first injection face 101a is configured so as to inject carriers of a first type into the first semiconductor element 105, and the second electrode 102 is configured so as to inject carriers of a second type into the second semiconductor element 106 (especially via the second injection face 102a of the second electrode 102). The expression "opposite conductivity" is understood to mean an electrical conductivity, the first semiconductor element 105 advantageously being n-doped and the second semiconductor element 106 advantageously being p-doped.

The first semiconductor element 105 is preferably n-doped because with such doping the injected carriers may spread more easily than is the case for p-type doping (by way of example, p-doped GaN has a resistivity of about 1 $\Omega \cdot cm$ whereas n-doped GaN has a resistivity of about $10^{-3}$ $\Omega \cdot cm$).

The stack may comprise III-V or II-VI materials. Thus, the first semiconductor element 105 may be formed from, or consist of, at least one of the following materials: GaN, ZnO, InSb, GaAs, InP, etc. which material or materials is/are arranged in the form of a layer of thickness preferably comprised between 150 nm and 10 μm. Moreover, the second semiconductor element 106 may be formed from, or consist of, at least one of the following materials: GaN, ZnO, InSb, GaAs, InP, etc. which material or materials is/are arranged in the form of a layer of thickness preferably comprised between 150 nm and 10 μm. The active zone may be formed by the junction between the first semiconductor element 105 and the second semiconductor element 106, which elements are then arranged making direct contact. This junction may be a homojunction or a heterojunction.

One or more additional semiconductor elements (not shown) may be interposed between the first semiconductor element and the second semiconductor element. It is for example possible to insert an active element in between the first and second semiconductor elements. This active element may be an intrinsic or nonintentionally doped semiconductor the band gap of which is suitable for emitting photons of the desired wavelength. Alternatively, this active element may be a system of quantum wells (e.g.: double heterojunction quantum wells).

The first and second semiconductor elements, and the one or more optional additional semiconductor elements, may each take the form of a layer of the stack.

Preferably, the dielectric element 104 is arranged so as to separate the first electrode 101 from the face of the first semiconductor element oriented towards the second electrode by a distance larger than 500 nm and preferably larger than 1 μm, and advantageously smaller than 25 μm. This makes it possible to distribute the current over longer distances.

As illustrated in FIGS. 5 and 7, the dielectric element 104 advantageously makes contact with the first electrode 101 and the first semiconductor element 105. In this embodiment, the dielectric element 104 does not make contact with the second semiconductor element 106 (instead part of the first semiconductor element 105 is advantageously interposed between the dielectric element 104 and the second semiconductor element 106).

Figure 8:
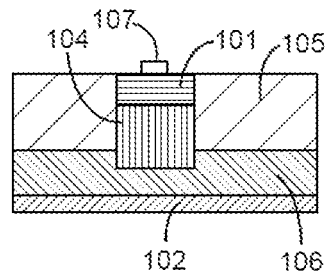

Alternatively and applicable to the various embodiments, the dielectric element 104 may, as in FIG. 8, make contact with the first electrode 101, the first semiconductor element 105, and the second semiconductor element 106. In the example in FIG. 8, part of the second semiconductor element 106 remains interposed between the dielectric element 104 and the second electrode 102. As the active zone is generally located between the first semiconductor element 105 and the second semiconductor element 106 (or is formed by their contact), this embodiment inhibits carrier recombination in a zone from which extraction is not possible.

Figure 9:
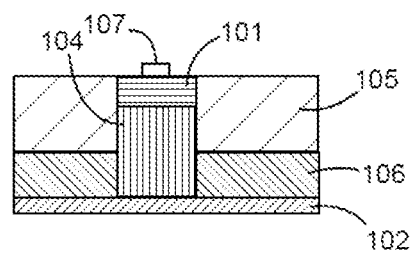

According to another alternative applicable to the various embodiments, the dielectric element 104 may, as in FIG. 9, make contact with the first electrode 101, the first semiconductor element 105, the second semiconductor element 106 and the second electrode 102. According to this alternative, there is sure to be no recombination in that zone of the stack 103 located above the first electrode 101.

According to one particular embodiment, illustrated in FIGS. 6 to 9, applicable to all the embodiments described, in combination with the presence of the dielectric element 104 a face of the first electrode 101, which face lies opposite, or facing, a face where the first electrode 101 makes contact with the dielectric element 104, comprises a connection pad 107 intended to interact with an element for supplying current to the structure.

It will be understood from the above, and especially from the embodiments in FIGS. 6 to 9, that at least one portion of the first electrode 101, extending from the dielectric element 104 in a direction opposite to the second electrode 102, is encircled by and makes contact with the first semiconductor element 105. Encircling the first electrode 101 in this way allows the contact area to be increased, allowing carriers to be injected into the stack 103 and more particularly into the first semiconductor element 105 of the stack 103.

Figure 10:
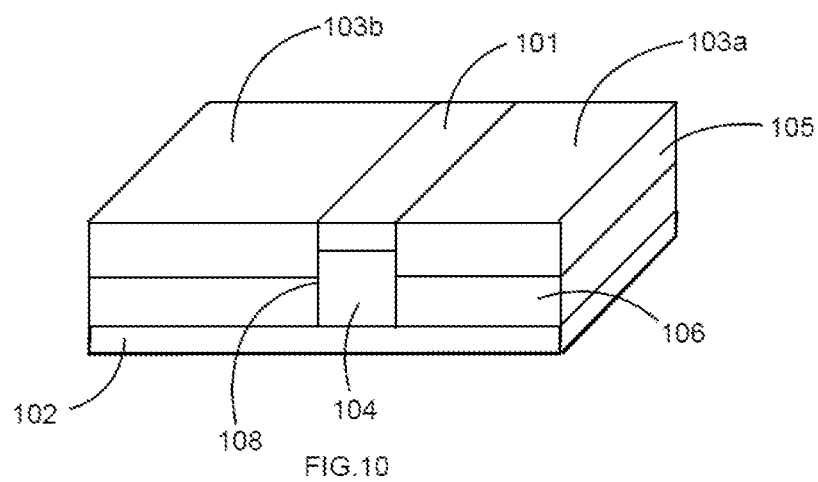
FIG. 10 shows one particular embodiment of the structure, comprising a plurality of stacks.

According to one particular embodiment, illustrated in FIG. 10, the structure comprises at least two separate stacks 103a, 103b extending from the second electrode 102. The dielectric element 104 extends from the second electrode 102 between the stacks 103a, 103b and makes contact with one part, bounded at least by the first and second semiconductor elements 105, 106 of a sidewall 108 of each of the stacks. Moreover, the first electrode 101 extends from the dielectric element 104 at least partially between the two stacks 103a, 103b, said first electrode 101 making contact with another part, bounded by the first semiconductor element 105, of the sidewall of each of the stacks 103a, 103b. In this particular configuration, the structure has a higher efficiency because of the larger contact area between the first electrode and the stacks and because the stacks are also less liable to have undergone dislocations during their formation (especially when it is a question of island growth).

Figure 11:
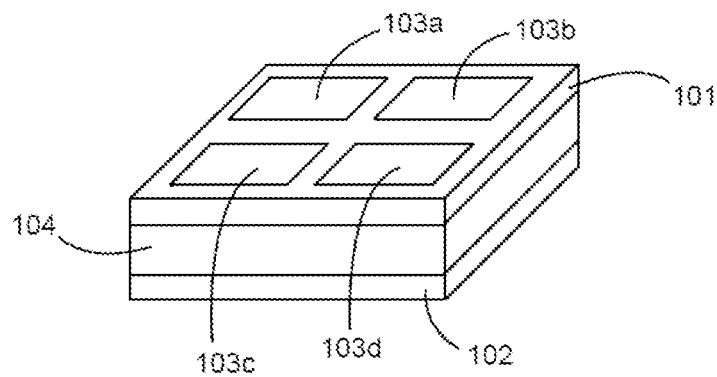
FIG. 11 illustrates a variant of FIG. 10.

According to one improvement to the embodiment in FIG. 10, the structure may comprise (FIG. 11) a plurality of separate stacks 103a, 103b, 103c, 103d extending from the second electrode common to all the stacks. Each stack then forms an isolated island. The dielectric element 104 also extends from the second electrode 102 so as to make contact with all the stacks 103a, 103b, 103c, 103d. Moreover, the first electrode 101 extends from the dielectric element 104 so as to make contact with all the stacks of the structure, said first electrode 101 then allowing carriers to be injected into each of the stacks 103a, 103b, 103c, 103d.

Figure 12:
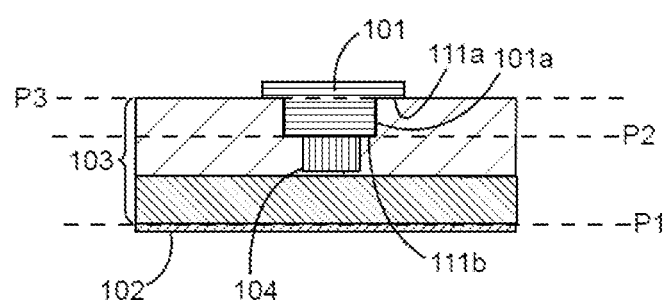
FIG. 12 illustrates a cross-sectional view of a particular configuration of a first electrode of the structure.

According to one example illustrated in FIG. 12, the first electrode 101 comprises at least two additional faces 111a, 111b for injecting carriers into the stack, each additional face being contained in planes P2, P3 shifted from and substantially parallel to the plane P1 containing the second electrode (in particular containing the second injection face) and preferably one of the additional faces 111a makes contact with that end of the stack 103 which is opposite the second electrode 102, and is connected to the other additional face 111b via the first injection face 101a. Thus it will be understood that part of said other additional face makes contact with the dielectric element 104. In other words, the first electrode 101 may comprise a section, in a plane parallel to the direction in which the stack is formed, the profile of which defines a shoulder intended to cover part of that stack end which is opposite the second electrode.

Figure 13:
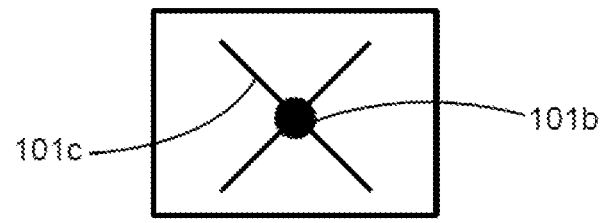
FIGS. 13 and 14 illustrate variants of the shape of the first electrode of the structure.
Figure 14:
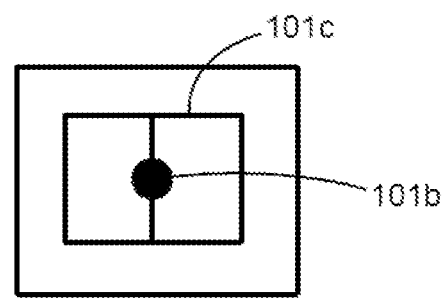

According to one particular embodiment, the contact area between the first electrode 101 and the first semiconductor element 105 may be increased by covering part of that face of the first semiconductor element 105 which is opposite the second electrode 102 (and which especially forms the emission face of the structure) with part of the first electrode 101, the dielectric element 104 not being interposed between said part of the first electrode 101 and the second electrode 102. This allows the contact area between the first electrode 101 and the first semiconductor element 105 to be increased so as to decrease the contact resistance. Of course, this part of the first electrode not associated with the dielectric element is of suitable size and shape, so as to achieve a good compromise between the efficiency of electromagnetic radiation emission from the structure and the aforementioned contact resistance. FIGS. 13 and 14 illustrate such examples where only the central part 101b is located vertically in line with the dielectric element, arms 101c extending along the emmission face of the structure from the central part 101b.

An emissive device, especially a displaying or illuminating device, may comprise at least one structure such as described, and advantageously an element for supplying each structure with electricity with a view to making it emit corresponding electromagnetic radiation.

In fact, each structure then forms one, or more, light-emitting diodes.

Moreover, the invention also relates to a process for fabricating a structure such as described. Such a process of fabricating the structure thus advantageously comprises a step of forming, especially by growth and preferably on a carrier substrate, the stack 103, and a step of forming, especially by deposition, the first electrode 101. It will be understood that the first electrode 101 comprises consecutively to its formation at least one first face 101a for injecting carriers, which face is oriented in a different direction from the direction in which the stack 103 is formed (FIGS. 3 to 5 and 7 to 12).

Typically, the stack is grown when the latter comprises the materials mentioned above. Advantageously, the stack comprises in succession on a sapphire substrate, a GaN buffer layer, an n-doped GaN layer, a layer of InGaN wells, and a p-doped GaN layer. Moreover, the process may also comprise a step of forming the second electrode 102 such as described, and a step of forming a dielectric element such as described.

Figure 15:
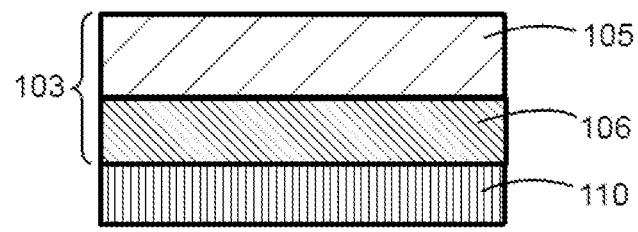
FIGS. 15 to 17 illustrate cross-sectional views of various steps of the process for fabricating the structure.

The step of forming the stack 103 may comprise, as illustrated in FIG. 15, forming, especially by growth, the first semiconductor element 105 and the second semiconductor element 106 that is intended to be interposed between the first semiconductor element 105 and the second electrode 102. Furthermore, the process may comprise a step (FIGS. 16 and 17) of etching at least the first semiconductor element 105 in the direction of the second semiconductor element 106 and a step of forming, especially by deposition, the dielectric element 104 in at least one part of the hole 109 created by the etching step, the step of forming the first electrode 101 being carried out by forming said first electrode 101 on the dielectric element 104, said first electrode 101 occupying at least one part of the rest of the hole. According to this embodiment, the step of etching at least the first semiconductor element uses a suitable mask, after a layer intended to form the dielectric element 104 and a layer intended to form the first electrode 101 have been deposited, the same suitable mask (an inverted mask or a negative resist may be used) may be reused to etch said layers in order to define the final dielectric element and the final first electrode. Moreover, because of the presence of the first injection face of the first electrode, it will be understood that the thickness of deposited dielectric is smaller than the depth of the hole obtained in the etching step. The depth of the etch will possibly be tailored to obtain any dielectric element configuration, such as described above.

Figure 16:
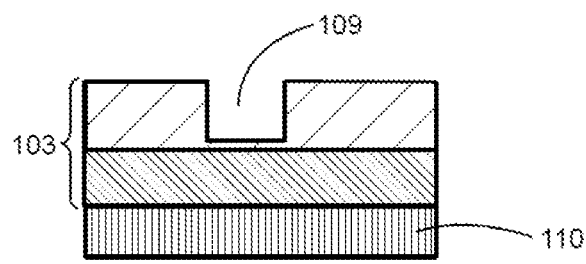
Figure 17:
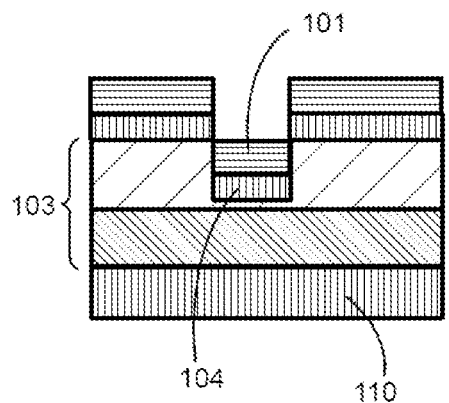

Advantageously, for reasons facilitating the technological steps and especially to prevent incompatibilities with growth of the stack on a carrier having an incompatible crystal structure, the stack will be formed before the first and second electrodes are formed. Thus, as mentioned above, the process may comprise a step of providing a carrier substrate 109 having a surface with crystal properties (such as crystal orientation and/or lattice parameter) suitable for growth of the stack 103 (FIGS. 15 to 17).

Next, according to a first embodiment employing the suitable carrier substrate, and especially in the case where the second semiconductor element makes contact with the carrier substrate 110 (FIGS. 15 to 17), the step of etching into at least the first semiconductor 105 is carried out on the top of the stack 103 opposite the carrier substrate 110. Once this has been done, the carrier substrate 110 will possibly be removed so as to leave that face of the second semiconductor element 106 which initially made contact with the carrier substrate 110 free, and the second electrode will be deposited preferably over all of that face of the second semiconductor element 106 which initially made contact with the carrier substrate 110.

According to a second embodiment (not shown) employing the carrier substrate, and especially in the case where the first semiconductor element makes contact with the carrier substrate, the second electrode will be formed on the top of the stack opposite the carrier substrate. Moreover, the carrier substrate will possibly be removed so as to leave that face of the first semiconductor element which initially made contact with the carrier substrate free, and the etching step will then possibly be carried out before forming, in the hole obtained by the etching, the dielectric element then the first electrode.

According to an alternative associated with the structure comprising a plurality of separate stacks, the fabrication process may comprise the following steps: forming at least two separate stacks, especially on a carrier substrate having a suitable crystal structure, each stack being equipped with a first semiconductor element and a second semiconductor element; forming a dielectric element in a free space separating the stacks, especially by conformal deposition of said dielectric element; and forming the first electrode so that it makes contact with the dielectric element and with that part of the sidewall of the stacks which is formed by the first semiconductor elements of said stacks. This alternative is especially relevant in the context where the stack is obtained by growing III-V or II-VI semiconductors. This is because these semiconductors require, at the very least, a fit between the lattice parameter of the corresponding semiconductor and that of the substrate on which the growth of said semiconductor takes place. In the case of too great a misfit in the lattice parameters, tensile or compressive stresses in the semiconductor must be relaxed, otherwise dislocations will form in the semiconductor crystal. These dislocations generate deep levels in the band gap of the semiconductor, which limit its electro-optical performance. In other words, forming stacks that are separate and small in size allows stresses to be limited in order to limit the formation of dislocations.

Preferably, as mentioned above, the carrier substrate has a crystal structure matched to the materials that it is desired to grow thereon. The main property of this substrate may be the lattice parameter mismatch (it must be as small as possible).

Figure 18:
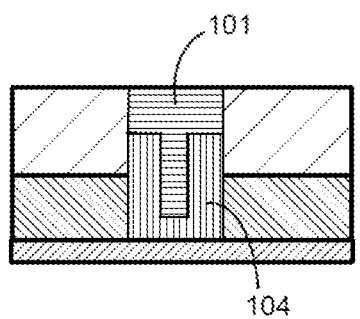
FIG. 18 illustrates a view of a particular step of the process for fabricating the structure.

According to one particular embodiment of the fabrication process, associated with the alternative given above and illustrated in FIG. 18, the sidewall of two adjacent stacks is covered with the dielectric element 104 via a conformal deposition, and the remaining available space is filled with the first electrode 101. This variant has the advantage of providing a first electrode 101 having a high aspect ratio while nonetheless preserving a low electrical resistance (therefore there is little ohmic loss distributing the current in the structure). In other words, generally, the first electrode 101 may be shaped so as to penetrate said dielectric element 104. It is also possible to envisage the electrode 101 extending as far as the back side of the semiconductor stack. In this configuration, the electrode formed on the back side will be structured so that the contacts of the two electrodes of the light-emitting diode are on the back side of the light-emitting diode while however being isolated from each other.

The fabrication process may comprise any desired step configured to produce all or some of the structure.

A process was described above for fabricating a structure such as described. It goes without saying that the process for fabricating the device such as described may comprise at least one step of implementing the process for manufacturing the structure.

The invention claimed is:

1. A structure intended to emit electromagnetic radiation, comprising:
   first and second electrodes configured so as to allow respective first and second carriers to be injected into at least one semiconductor-based stack with a view to making the first and second carriers recombine in an active zone of the stack in order to form at least a portion of the electromagnetic radiation to be emitted,
   the first electrode having at least one first injection face for injecting the first carriers into the stack, said first injection face facing a different direction from a direction in which the stack is formed, and
   the second electrode comprising a second injection face for injecting the second carriers into the stack, wherein said second injection face comprises a first portion facing the first electrode and a second portion not facing the first electrode, and
   a dielectric element, making contact with the first electrode, wherein the dielectric element is interposed between an entirety of the first electrode and at least one part of the first portion of the second electrode,
   wherein substantially at any point of the first injection face, a straight line normal to the first injection face is substantially perpendicular to the direction in which the stack is formed, and
   wherein substantially at any point of the second injection face, a straight line normal to the second injection face has a direction substantially different from the straight line normal to the first injection face substantially at any point of the first injection face,
   wherein the stack comprises:
   a first semiconductor element doped with a first dopant, and
   a second semiconductor element doped with a second dopant of opposite conductivity to the first dopant,
   wherein the first injection face is configured so that substantially the entire first injection face injects carriers of a first type directly into the first semiconductor element, and
   wherein the second electrode is configured so as to inject carriers of a second type into the second semiconductor element.

2. The structure according to claim 1, wherein the first semiconductor element is n-doped.

3. The structure according to claim 1, wherein the dielectric element makes contact with:
   the first electrode and the first semiconductor element; or
   the first electrode, the first semiconductor element and the second semiconductor element; or
   the first electrode, the first semiconductor element, the second semiconductor element and the second electrode.

4. The structure according to claim 1, wherein at least one portion of the first electrode extending from the dielectric element in a direction opposite to the second electrode is encircled by and makes contact with the first semiconductor element.

5. The structure according to claim 1, wherein it comprises at least two separate stacks extending from the second electrode, and:
   the dielectric element extends from the second electrode between the stacks, and makes contact with one part, bounded at least by the first and second semiconductor elements, of a sidewall of each of the stacks; and
   the first electrode extends from the dielectric element at least partially between the two stacks, said first electrode making contact with another part, bounded by the first semiconductor element, of the sidewall of each of the stacks.

6. An emissive device, comprising at least one structure according to claim 1.

7. An emissive device, which is a displaying or illuminating device, comprising at least one structure according to claim 1.

8. The structure according to claim 1, wherein the dielectric element makes contact with the first electrode and the first semiconductor element, but not with the second semiconductor element.

9. The structure according to claim 1, wherein the first electrode has an open face, wherein the entire open face is level with an emissive face of the stack.

10. The structure according to claim 1, wherein an emissive face of the stack is located on an opposite side of the stack relative to the second electrode.

11. The structure according to claim 1, wherein the first injection face is not facing the second electrode.

12. The structure according to claim 1, wherein substantially at any point of the second injection face, the straight line normal to the second injection face has a direction substantially perpendicular to the straight line normal to the first injection face substantially at any point of the first injection face.

13. The structure according to claim 1, wherein the second injection face is planar.

14. A process for fabricating a structure, wherein the process comprises obtaining the structure according to claim 1 by a method comprising:
   forming the stack;
   forming the first electrode; and
   forming the second electrode so that the second electrode comprises the second injection face for injecting carriers into the stack, the second injection face comprising the first portion facing the first electrode and the second portion not facing the first electrode,
   wherein the dielectric element, making contact with the first electrode, is interposed between an entirety of the first electrode and at least one part of the first portion.

15. The process according to the claim 14, wherein at least one of (i) the stack is formed by growth and (ii) the first electrode is formed by deposition.

16. The process according to claim 14, wherein the forming of the stack comprises forming the first semiconductor element and forming the second semiconductor element intended to be interposed between the first semiconductor element and the second electrode.

17. The process according to claim 16, which comprises etching at least the first semiconductor element in a direction of the second semiconductor element, and forming the dielectric element in at least one part of a hole created by the etching, the forming of the first electrode being carried out by forming the first electrode on the dielectric element.

18. The process according to claim 17, wherein the dielectric element is formed by deposition.

19. The process according to claim 14, which comprises:
   forming at least two separate stacks, each stack being equipped with a respective first semiconductor element and a respective second semiconductor element;
   forming the dielectric element in a free space separating the stacks; and
   forming the first electrode so that the first electrode makes contact with the dielectric element and with a part of the sidewall of the stacks which is formed by the first semiconductor elements of the stacks.

20. The process according to claim 19, wherein at least one of (i) the at least two separate stacks are formed on a carrier substrate having a crystal structure suitable for growth of the stacks and (ii) the dielectric element is formed by conformal deposition of the dielectric element.

* * * * *